US009946130B2

(12) United States Patent
Okita et al.

(10) Patent No.: US 9,946,130 B2
(45) Date of Patent: Apr. 17, 2018

(54) DISPLAY DEVICE

(71) Applicant: Japan Display Inc., Tokyo (JP)

(72) Inventors: Mitsutaka Okita, Tokyo (JP); Noriyoshi Kanda, Tokyo (JP); Toshiyuki Higano, Tokyo (JP)

(73) Assignee: Japan Display Inc., Tokyo (JP)

( * ) Notice: Subject to any disclaimer, the term of this patent is extended or adjusted under 35 U.S.C. 154(b) by 147 days.

(21) Appl. No.: 14/944,536

(22) Filed: Nov. 18, 2015

(65) Prior Publication Data

US 2016/0139469 A1 May 19, 2016

(30) Foreign Application Priority Data

Nov. 19, 2014 (JP) ................................ 2014-234689

(51) Int. Cl.

*G02F 1/1362* (2006.01)
*G02F 1/1343* (2006.01)
*G02F 1/1368* (2006.01)
*G02F 1/1333* (2006.01)
*H01L 27/12* (2006.01)

(52) U.S. Cl.

CPC ...... *G02F 1/136227* (2013.01); *G02F 1/1368* (2013.01); *G02F 1/133345* (2013.01); *G02F 1/134309* (2013.01); *G02F 2001/134345* (2013.01); *H01L 27/124* (2013.01); *H01L 27/1248* (2013.01)

(58) Field of Classification Search

CPC ............ G02F 1/1368; G02F 1/133343; G02F 1/134209; G02F 1/134309; G02F 1/136227

See application file for complete search history.

(56) References Cited

U.S. PATENT DOCUMENTS 7,903,219 B2 * 3/2011 Sakurai ............ G02F 1/133345 349/138
2012/0314169 A1 12/2012 Naoe et al.
2015/0221684 A1 8/2015 Kanda
2015/0221732 A1 8/2015 Kanda

FOREIGN PATENT DOCUMENTS

JP 2013-003200 A 1/2013

* cited by examiner

*Primary Examiner* — Dung Nguyen
(74) *Attorney, Agent, or Firm* — Typha IP LLC

(57) ABSTRACT

A display device includes: first and second drain electrodes; an organic insulating film; an inorganic insulating film formed on the organic insulating film; and first and second pixel electrodes formed on the inorganic insulating film. The organic insulating film includes an organic insulating film opening spanning the first drain electrode and the second drain electrode. The inorganic insulating film covering the organic insulating film includes first and second inorganic insulating film openings. The first pixel electrode is connected to the first drain electrode via the first inorganic insulating film opening. The second pixel electrode is connected to the second drain electrode via the second inorganic insulating film opening.

18 Claims, 11 Drawing Sheets

DISPLAY DEVICE

CLAIM OF PRIORITY

The present application claims priority from Japanese patent application JP2014-234689 filed on Nov. 19, 2014, the content of which is hereby incorporated by reference into this application.

BACKGROUND

The present invention relates to a display device and is applicable to, for example, a display device including a contact hole for connection of a pixel electrode with a source/drain electrode.

Recently, liquid crystal display devices for smartphones and tablet computers have achieved high definition. The liquid crystal display devices are minimized in pixel size while panels with pixel densities of 400 ppi or more are commercialized. A liquid crystal display device featuring a resolution of 600 ppi has also been developed.

The prior arts related to this invention are disclosed in JP-A No. 2013-003200 and its corresponding U.S. Pat. No. 2012/0314169.

SUMMARY

With the decrease in pixel size, the area ratio of a black matrix (a light shielding layer covering gate wirings, signal wirings, contact holes for connection of pixel electrodes with drain electrodes of thin film transistors (TFTs), and the like) to the pixel area increases so that the opening ratio decreases. Therefore, the high-definition liquid crystal display device is lowered in transmittance, which dictates the need for increasing the brightness of a backlight. This leads to the increase of power consumption. While a TFT electrode connected to the pixel electrode may sometimes be called a source electrode, this TFT electrode is referred to as a drain electrode herein.

The other objects and novel features of the invention will become apparent from the description of the invention and the accompanying drawings thereof.

A typical embodiment of the invention is briefly described as follows.

Specifically, the display device includes an array substrate and a counter substrate. The array substrate includes: first and second drain electrodes; signal lines; an organic insulating film formed on the signal lines; an inorganic insulating film formed on the organic insulting film; and first and second pixel electrodes formed on the inorganic insulating film. The organic insulating film includes an organic insulating film opening spanning the first drain electrode and the second drain electrode. The inorganic insulating film covering the organic insulating film opening includes first and second inorganic insulating film openings. The first pixel electrode is connected to the first drain electrode via the first inorganic insulating film opening. The second pixel electrode is connected to the second drain electrode via the second inorganic insulating film opening.

DESCRIPTION OF THE PRESENT EMBODIMENTS

Figure 1:
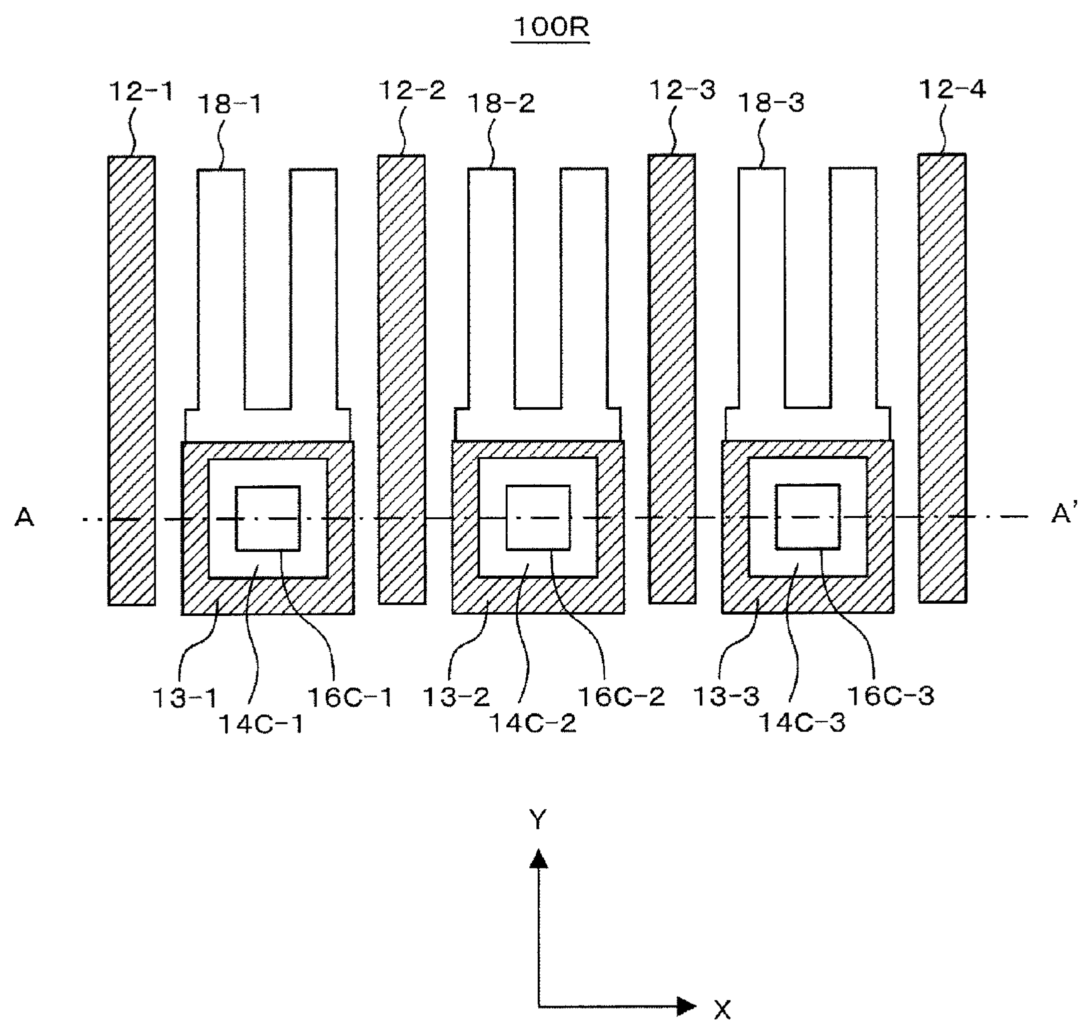
FIG. 1 is a plan view for illustrating a display device according to a first comparative example.

The embodiment and examples of the invention, and comparative examples will hereinbelow be described with reference to the accompanying drawings. It is to be understood that the disclosure is merely an exemplary representation of the invention and changes and modifications that are made without departing from the spirit of the invention and apparent to those skilled in the art are dully included therein. In some cases for clarity purposes, the drawing may schematically show the width, thickness, configuration and the like of components rather than a realistic picture thereof. However, the examples are intended for purposes of illustration only and are not intended to limit the scope of the invention. In the description and drawings, the same or similar reference numerals are used to refer to the same or similar components which are explained only once in some cases to avoid repetition.

First Comparative Example

Figure 2:
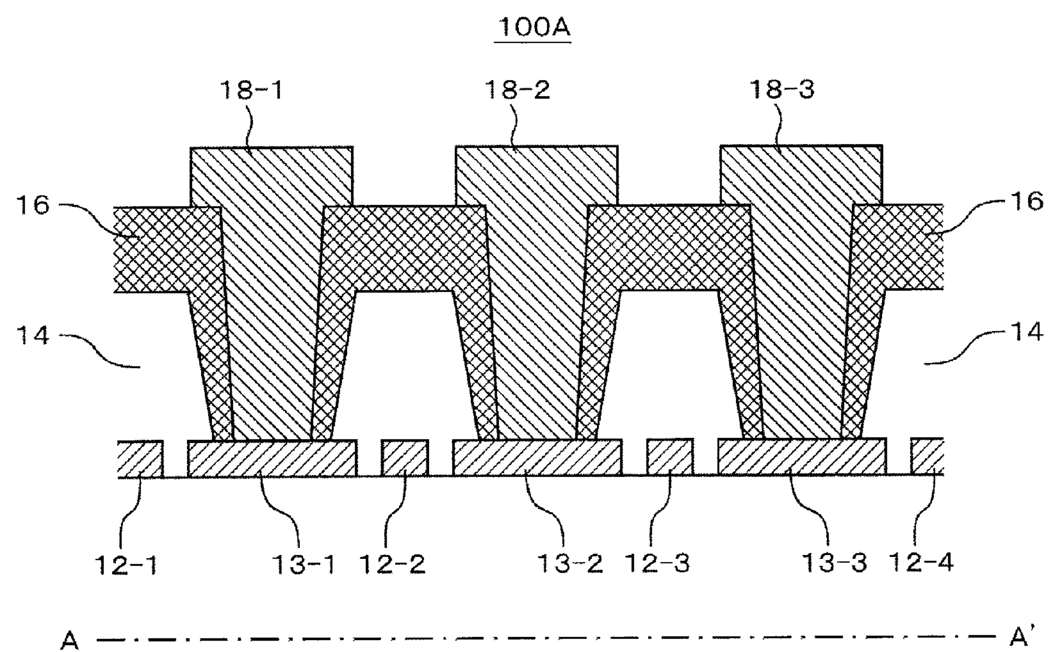
FIG. 2 is a sectional view for illustrating the display device according to the first comparative example.

First, description is made on a technique examined by the present inventors (hereinafter, referred to as a first comparative example) with reference to FIG. 1 and FIG. 2. FIG. 1 is a plan view showing a configuration of a display device according to the first comparative example, which configuration is equivalent to one pixel (three subpixels). FIG. 2 is a sectional view taken on the line A-A' in FIG. 1.

A display device 100R according to the first comparative example includes: signal lines 12-1, 12-2, 12-3; drain electrodes 13-1, 13-2, 13-3; and an organic insulating film 14 formed on the signal lines 12-1, 12-2, 12-3 and the drain electrodes 13-1, 13-2, 13-3. The display device 100R further includes: an inorganic insulating film 16 formed on openings (contact holes) 14C-1, 14C-2, 14C-3 of the organic insulating film 14 and the organic insulating film 14; and pixel electrodes 18-1, 18-2, 18-3 formed on openings (contact holes) 16-1, 16-2, 16-3 of the inorganic insulating film 16 and the inorganic insulating film 16. In the display device 100R, the opening of the organic insulating film is formed on a per subpixel basis so as to provide connection between the pixel electrode and the drain electrode. It is noted that the organic insulating film is formed thicker than the inorganic insulating film in order to function as a flattening film. This pixel configuration has a problem that as the pixel is reduced in size due to pixel miniaturization, the opening of the organic insulating film must be reduced in size, as well. However, the minimum opening width of the organic insulating film cannot be reduced so much as the minimum opening width of the inorganic insulating film. Furthermore, the drain electrode must be larger than the minimum opening width of the organic insulating film and hence, the display device is decreased in the opening ratio. This results in difficulty of making a pixel layout of high definition pixels.

Embodiment

Figure 3:
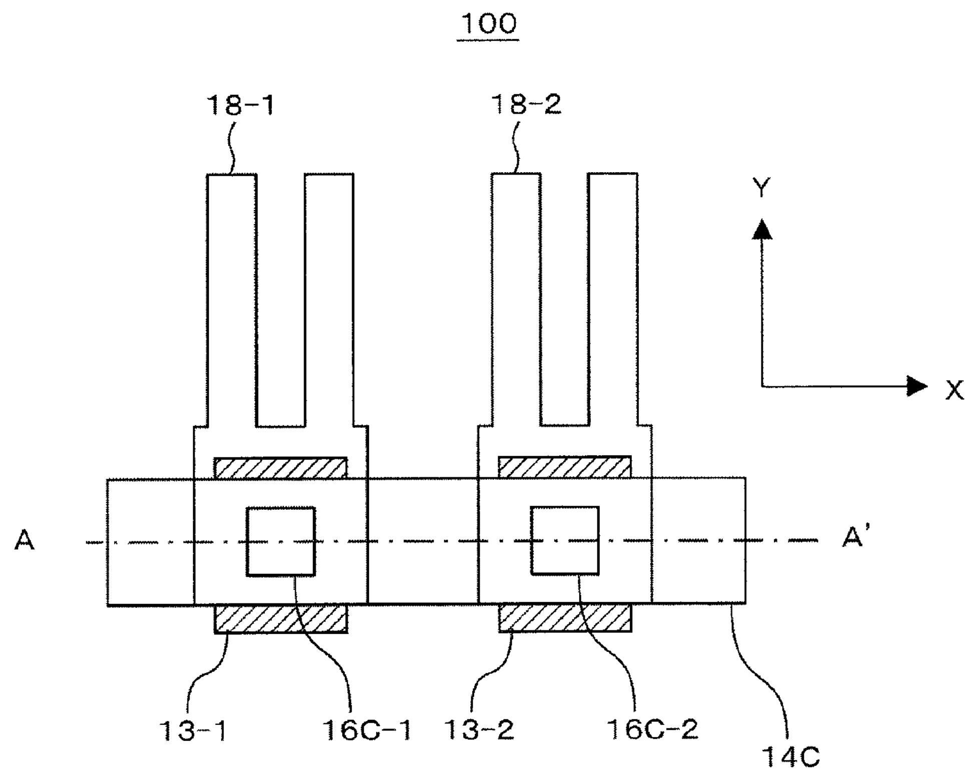
FIG. 3 is a plan view for illustrating a display device according to an embodiment of the invention.
Figure 4:
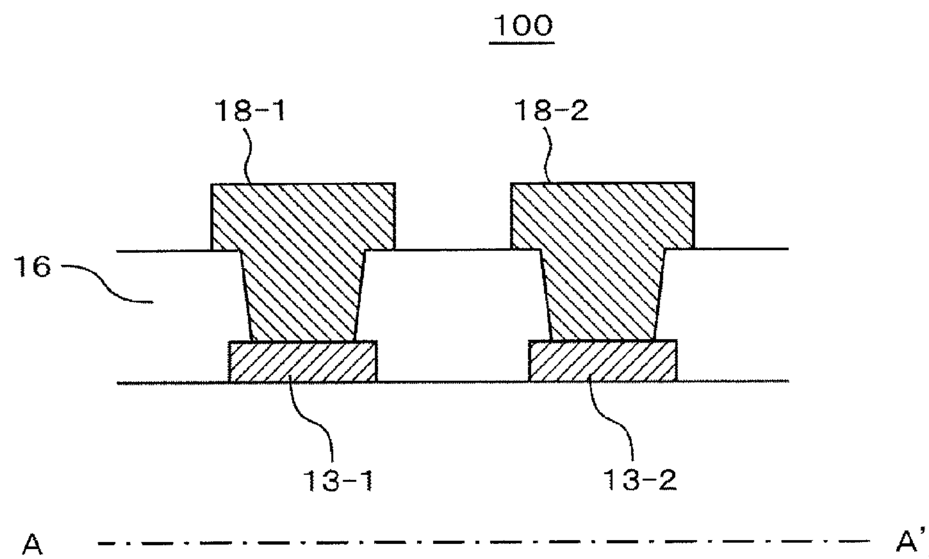
FIG. 4 is a sectional view for illustrating the display device according to the embodiment.

A display device according to an embodiment of the invention is described with reference to FIG. 3 and FIG. 4. FIG. 3 is a plan view showing a configuration of the display device according to the embodiment of the invention. FIG. 4 is a sectional view taken on the line A-A' in FIG. 1.

A display device 100 according to the embodiment includes: the drain electrodes 13-1, 13-2; the organic insulating film 14 formed on the drain electrodes 13-1, 13-2; the inorganic insulating film 16 formed on an opening 14C of the organic film 14 and the organic insulating film 14; and the pixel electrodes 18-1, 18-2 formed on the openings 16C-1, 16C-2 of the inorganic insulating film 16 and the inorganic insulating film 16.

In the display device 100, the opening of the organic insulating film is so formed as to span a plurality of subpixels for providing connection of the pixel electrodes with the drain electrodes. This pixel configuration negates the need for minifying the opening of the organic insulating film even though the pixel is miniaturized in size. The size of the drain electrode just need be larger than the minimum opening width of the inorganic insulating film. A Y-direction width of the drain electrode is shown larger than a Y-direction width of the opening 14C of the organic insulating film, but may be defined to be smaller than the Y-direction width of the opening 14C of the organic insulating film. The drain electrode can be reduced in size because the minimum opening width of the inorganic insulating film can be defined to be smaller than the minimum opening width of the organic insulating film, as described above. Therefore, the display device can be increased in the opening ratio and even allows for a pixel layout of the high definition pixels with narrower pixel pitch.

First Example

Figure 5:
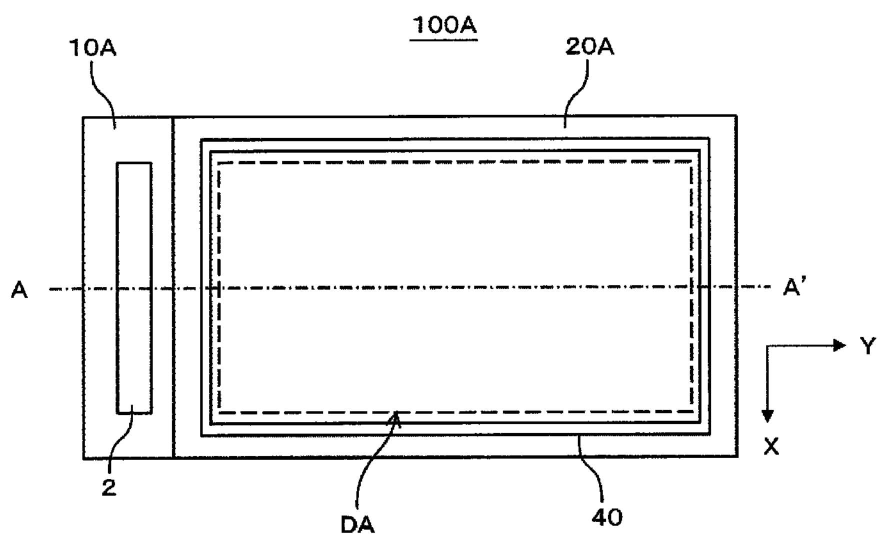
FIG. 5 is a plan view for illustrating a display device according to a first example of the embodiment.
Figure 6:
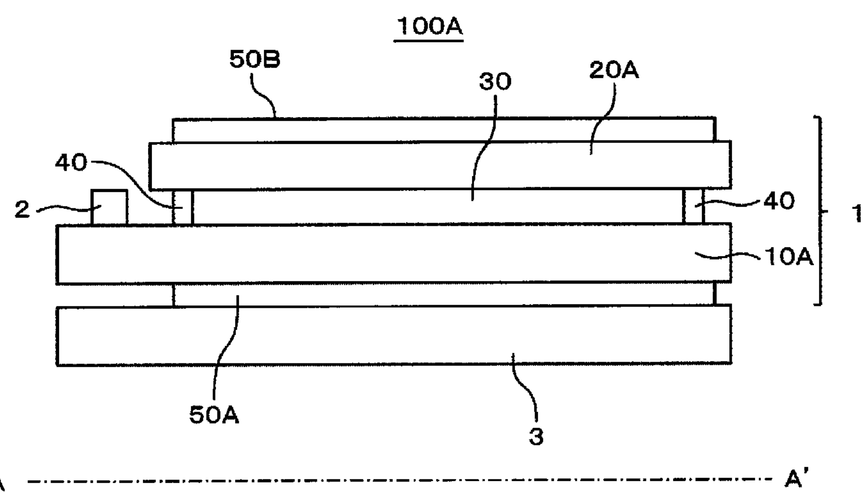
FIG. 6 is a sectional view for illustrating the display device according to the first example.
Figure 7:
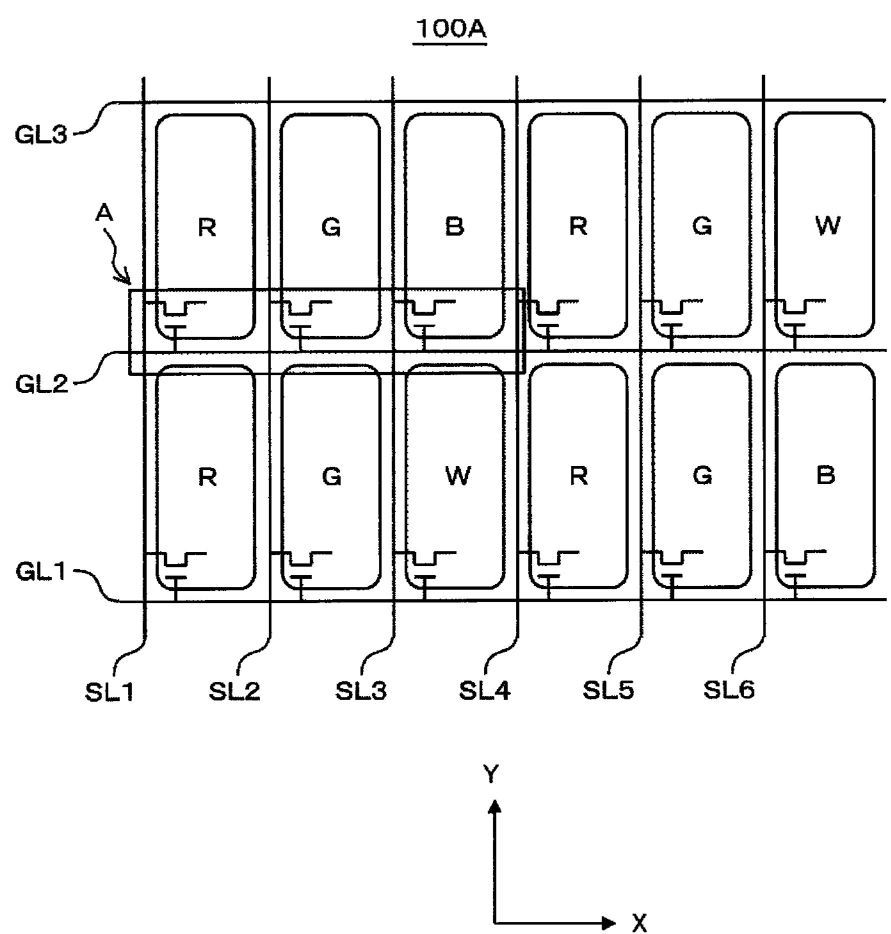
FIG. 7 is a sectional view for illustrating the display device according to the first example.
Figure 8:
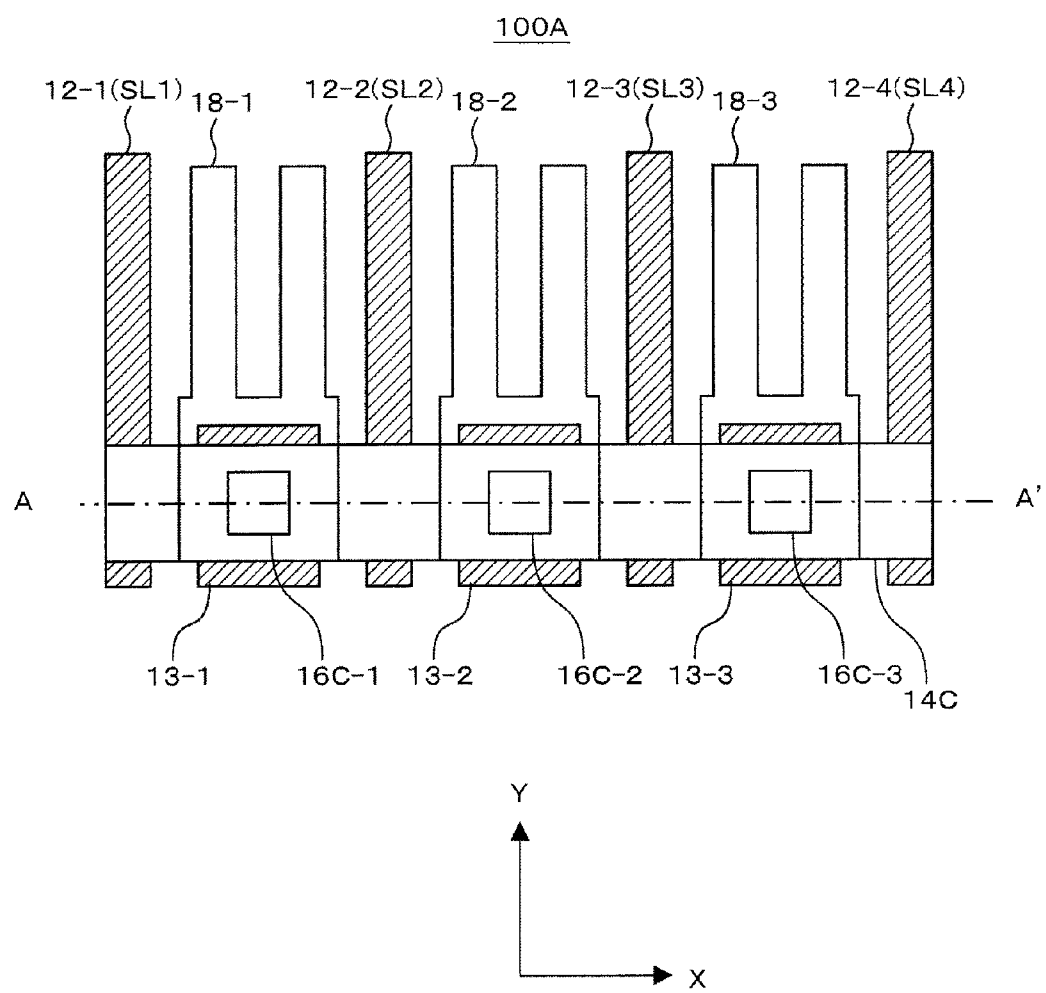
FIG. 8 is a plan view for illustrating the display device according to the first example.
Figure 9:
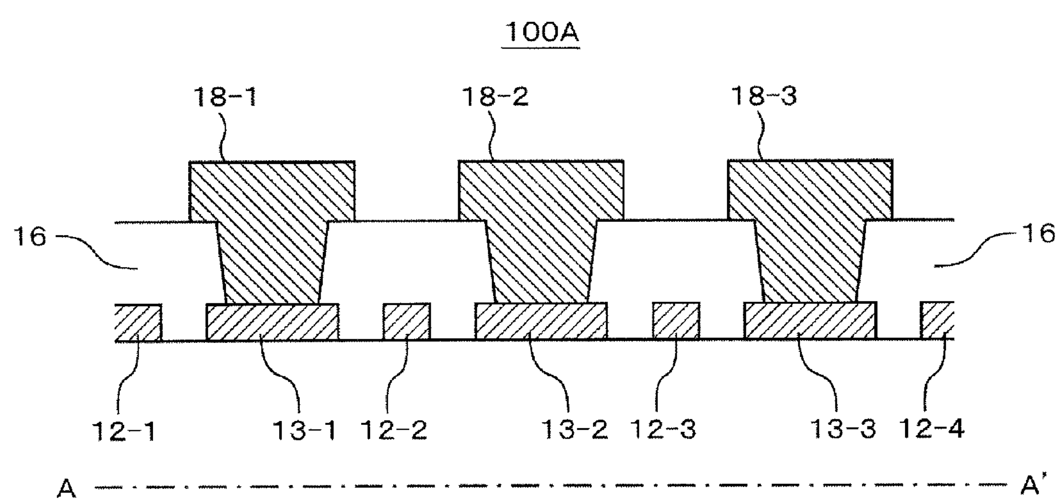
FIG. 9 is a sectional view for illustrating the display device according to the first example.

A display device according to a first example of the embodiment is described with reference to FIG. 5 to FIG. 9. FIG. 5 is a general plan view of the display device according to the first example. FIG. 6 is a sectional view taken on the line A-A' in FIG. 5. FIG. 7 is a plan view for illustrating a layout of pixels, scanning lines and signal lines of the display device according to the first example. FIG. 8 is a plan view showing a pixel contact at the area A in FIG. 7, which is equivalent to one pixel (three subpixels). FIG. 9 is a sectional view taken on the line A-A' in FIG. 8.

As shown in FIG. 5 and FIG. 6, a display device 100A according to the first example includes: a display panel 1, a driver IC2, and a backlight 3. The display panel 1 includes: an array substrate 10A, a counter substrate 20A, and a liquid crystal material 30 sealed between the array substrate 10A and the counter substrate 20A. The array substrate 10A and the counter substrate 20A are bonded together with a ring-like sealing material 40 enclosing a display area DA. The liquid crystal material 30 is sealed in a space enclosed by the array substrate 10A, the counter substrate 20A and the sealing material 40. The array substrate 10A and the counter substrate 20A are respectively provided with a lower polarizer plate 50A and an upper polarizer plate 50B on an outside surface thereof, namely on a side opposite from its surface faced with the liquid crystal material 30. The display area DA includes a set of plural pixels arranged in a matrix form, for example. The array substrate 10A includes: the signal lines extended in the Y-direction, the scanning lines extended in an X-direction, and the pixel electrodes, which will be described hereinlater; a scanning circuit formed of an unillustrated TFT and functioning to drive the scanning lines; and the like. The counter substrate 20A includes: a black matrix and color filters, which are not shown; and the like. The driver IC2 includes an unillustrated circuit for driving the signal lines, and the like.

As shown in FIG. 7, the display device 100A includes: a first pixel consisting of a red (R) subpixel, a green (G) subpixel and a white (W) subpixel; and a second pixel consisting of a red (R) subpixel, a green (G) subpixel and a blue (B) subpixel. In order to increase the transmittance by addition of the W subpixel, the display device 100A has a half of the B subpixel replaced with the W subpixel. The first pixel has the R subpixel, the G subpixel and the W subpixel contiguously arranged in the X-direction. The second pixel has the R subpixel, the G subpixel and the B subpixel contiguously arranged in the X-direction. The first pixel and the second pixel are alternately arranged in the X-direction. Further, the first pixel and the second pixel are alternately arranged in the Y-direction.

The R subpixel, the G subpixel, the B subpixel and the W subpixel each include a thin film transistor (TFT) connected to the scanning line (gate line) and the signal line (source line). The scanning line is connected to a gate electrode of the TFT while the signal line is connected to a source electrode of the TFT. It is noted that the signal line is sometimes called a drain line and a TFT electrode connected to the drain line is called a drain electrode. The R subpixels are connected to a signal line SL1. The G subpixels are connected to a signal line SL". The W subpixel and the B subpixel are connected to a signal line SL3.

As shown in FIG. 8 and FIG. 9, the array substrate 10A of the display device 100A includes: the signal lines 12-1 (SL1), 12-2 (SL2), 12-3 (SL3); the drain electrodes 13-1, 13-2, 13-3; and the organic insulating film 14 formed on the signal lines 12-1, 12-2, 12-3 and the drain electrodes 13-1, 13-2, 13-3. The array substrate 10A further includes: the inorganic insulating film 16 formed on the opening (contact hole) 14C of the organic film 14 and the organic insulating film 14; and the pixel electrodes 18-1, 18-2, 18-3 formed on the openings (contact holes) 16C-1, 16C-2, 16-3 of the inorganic insulating film 16 and the inorganic insulating film 16. The array substrate 10A also includes an unillustrated glass substrate and the unillustrated TFTs connected to the drain electrodes; the scanning lines connected to the gate electrodes of the TFTs; a common electrode disposed between the organic insulating film 14 and the inorganic insulating film 16; and the like. The organic insulating film 14 is formed thicker than the inorganic insulating film 16 in order to function as the flattening film. The signal lines are connected to the unillustrated source electrodes of the TFTs.

In the display device 100A, the opening 14C of the organic insulating film is so formed as to span three subpixels (one pixel) for providing connection of the drain electrodes 13-1, 13-2, 13-3 with the pixel electrodes 18-1, 18-2, 18-3. This pixel configuration negates the need for minifying the opening of the organic insulating film even though the pixel is miniaturized in size. The size of the drain electrode just need be larger than the minimum opening width of the inorganic insulating film. The drain electrode can be reduced in size because the minimum opening width of the inorganic insulating film can be defined to be smaller than the minimum opening width of the organic insulating film, as described above.

Although the opening 14C of the organic insulating film is so formed as to span three subpixels (one pixel), the opening 14C of the organic insulating film may also be so formed as to span more than one pixel or all the pixels in the X-direction. The Y-direction width of the drain electrode is larger than the Y-direction width of the opening 14C of the organic insulating film, but may also be defined to be smaller than the Y-direction width of the opening 14C of the organic insulating film.

Second Example

Figure 10:
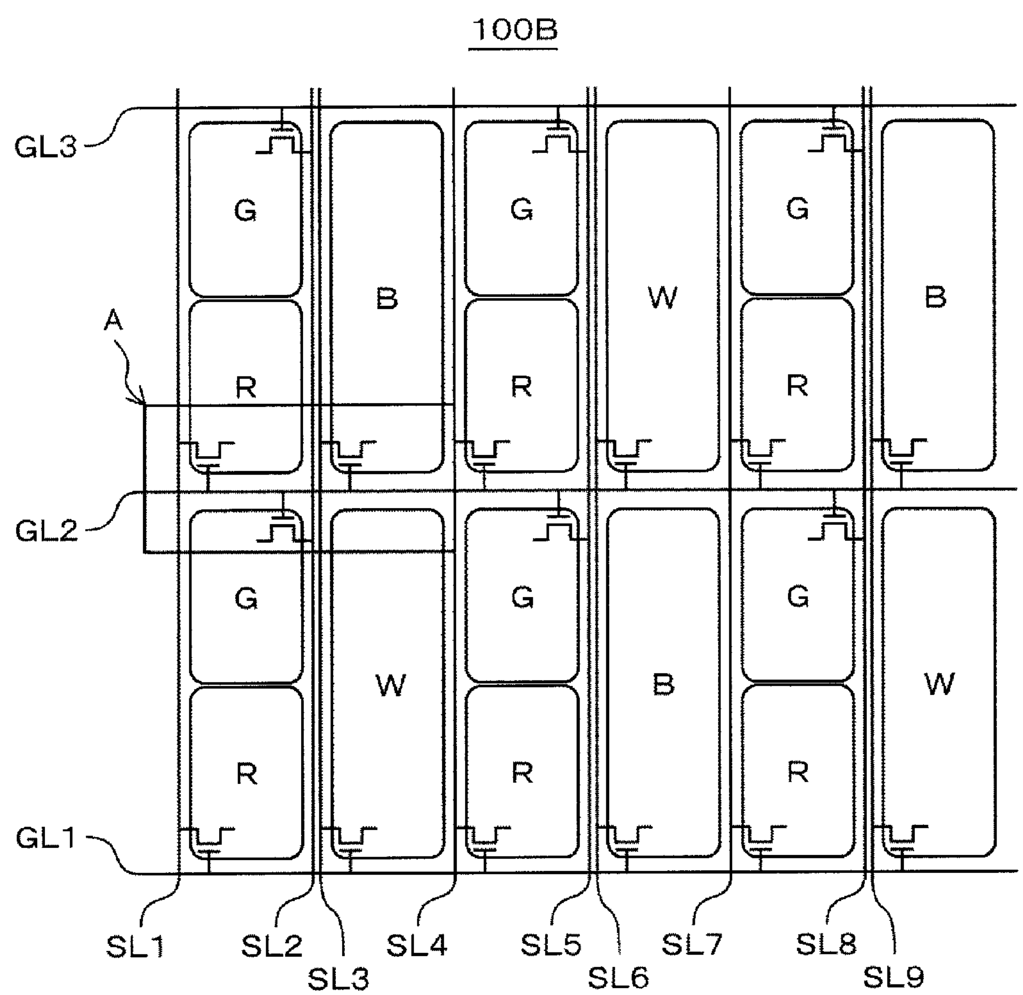
FIG. 10 is a plan view for illustrating a display device according to a second example of the embodiment.
Figure 12:
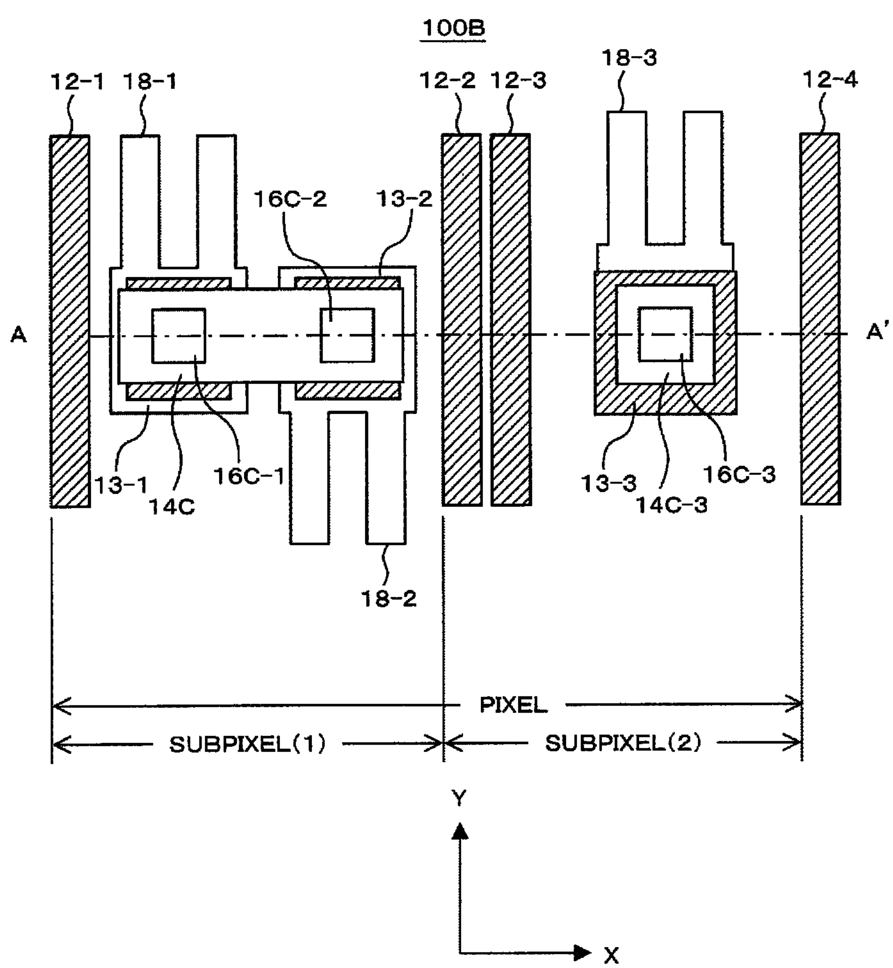
FIG. 12 is a plan view for illustrating the display device according to the second example.
Figure 13:
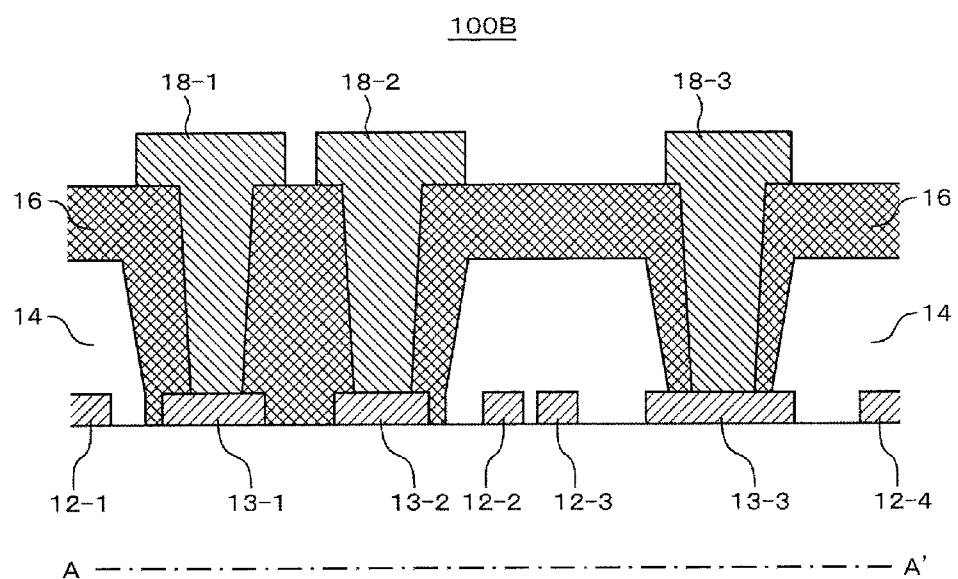
FIG. 13 is a sectional view for illustrating the display device according to the second example.

A display device according to a second example of the embodiment is described with reference to FIG. 10, FIG. 12 and FIG. 13. FIG. 10 is a plan view for illustrating a layout of the pixels, scanning lines and signal lines of the display device according to the second example. FIG. 12 is a plan view showing a pixel contact at the area A in FIG. 7, which is equivalent to one pixel (three subpixels). FIG. 13 is a sectional view taken on the line A-A' in FIG. 12.

A display device 100B according to the second example basically has the same configuration as the display device 100A according to the first example except for the layout of the pixels and signal lines. As shown in FIG. 10, the display device 100B includes: the first pixel consisting of the R subpixel, the G subpixel and the W subpixel; and the second pixel consisting of the R subpixel, the G subpixel and the B subpixel. In order to increase the transmittance by addition of the W subpixel, the display device 100B has a half of the B subpixel replaced with the W subpixel. The opening area of each of the G subpixel and the R subpixel is defined to be about a half of the opening area of each of the B subpixel and the W subpixel. The first pixel has the R subpixel and the G subpixel contiguously arranged in the Y-direction, and the R subpixel/the G subpixel and the W subpixel contiguously arranged in the X-direction. The second pixel has the R subpixel and the G subpixel contiguously arranged in the Y-direction, and the R subpixel/the G subpixel and the B subpixel contiguously arranged in the X-direction. The first pixel and the second pixel are alternately arranged in the X-direction. The first pixel and the second pixel are alternately arranged in the Y-direction.

The R subpixel, the G subpixel, the B subpixel and the W subpixel each include the thin film transistor (TFT) connected to the scanning line (gate line) and the signal line (source line). The scanning line is connected to the gate electrode of the TFT while the signal line is connected to the source electrode of the TFT. It is noted that the signal line is sometimes called the drain line and the TFT electrode connected to the drain line is called the drain electrode.

The R subpixel and the W subpixel of the first pixel disposed between a scanning line GL1 and a scanning line GL2 are connected to the scanning line GL1 while the G subpixel is connected to the scanning line GL2. The R subpixel and the B subpixel of the second pixel disposed between the scanning line GL1 and the scanning line GL2 are connected to the scanning line GL1 while the G subpixel is connected to the scanning line GL2. In other words, the G subpixel of the first pixel and the R subpixel of the second pixel, which subpixels adjoin via the scanning line GL2, are connected to the scanning line GL2. Further, the G subpixel of the second pixel and the R subpixel of the first pixel, which subpixels adjoin via the scanning line GL2, are connected to the scanning line GL2. Of the W subpixel of the first pixel and the B subpixel of the second pixel, which subpixels adjoin via the scanning line GL2, the W subpixel of the first pixel is connected to the scanning line GL1 while the B subpixel of the second pixel is connected to the scanning line GL2. Namely, the G subpixel and the R subpixel adjoining in the Y-direction are connected to the same scanning line while the W subpixel and the B subpixel adjoining in the Y-direction are connected to the different scanning lines.

The R subpixel is connected to the signal line SL1, the G subpixel is connected to the signal line SL2, and the W subpixel and the B subpixel are connected to the signal line SL3. The R subpixel and the G subpixel are disposed between the signal line SL1 and the signal line SL2. The W subpixel and the B subpixel are disposed between the signal line SL3 and a signal line SL4. In other words, the R subpixels disposed between the signal line SL1 and the signal line SL2 are connected to the signal line SL1. The G subpixels disposed between the signal line SL1 and the signal line SL2 are connected to the signal line SL2. The W subpixels and the B subpixels disposed between the signal line SL3 and the signal line SL4 are connected to the signal line SL3. It is noted that no subpixel is disposed between the signal line SL2 and the signal line SL3. Namely, signal line layout includes two patterns. In one pattern, one signal line is laid between the subpixels. In the other pattern, two signal lines are laid between the subpixels.

Second Comparative Example

Figure 11:
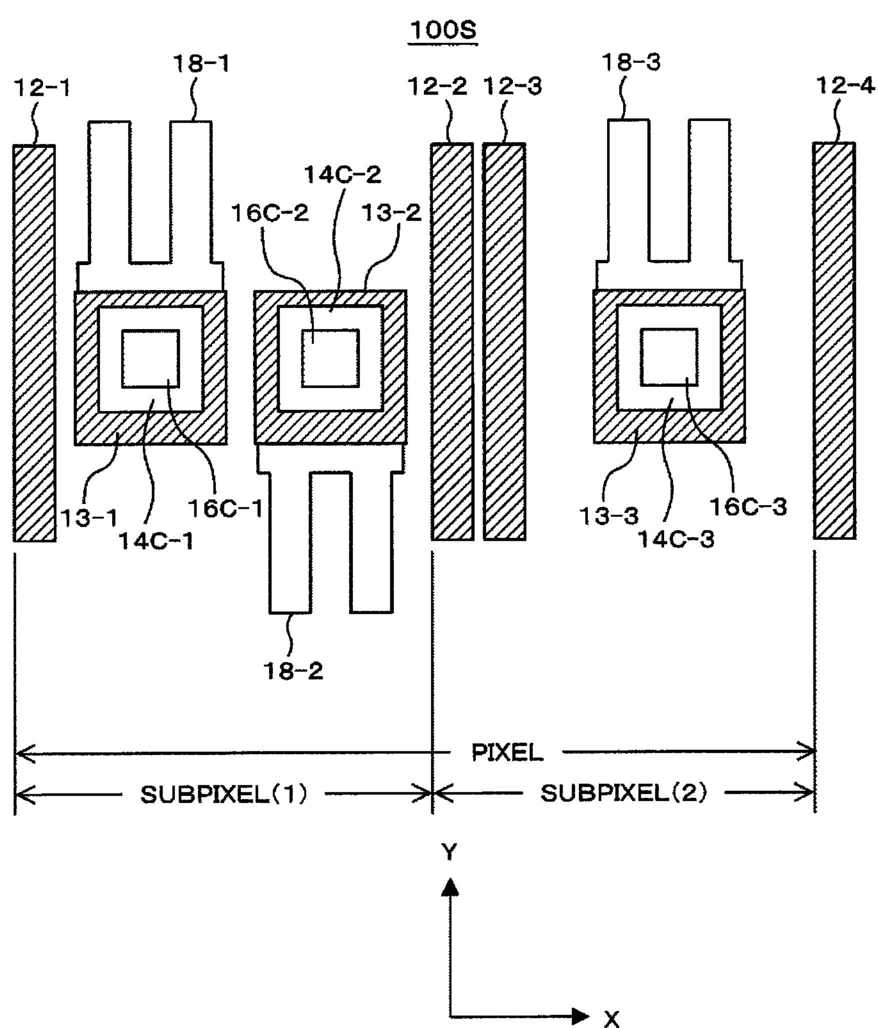
FIG. 11 is a plan view for illustrating a display device according to a second comparative example.

Referring to FIG. 11, description is made on an example (hereinafter, referred to as a second comparative example) where a pixel array of the display device according to the second example is provided with the same opening of the organic insulating film as that of the first comparative example. FIG. 11 is a plan view showing a configuration of the display device according to the second comparative example, which configuration is equivalent to one pixel (three subpixels).

A display device 100S according to the second comparative example includes: the signal lines 12-1, 12-2, 12-3, 12-4; the drain electrodes 13-1, 13-2, 13-3; and the organic insulating film 14 formed on the signal lines 12-1, 12-2, 12-3 and the drain electrodes 13-1, 13-2, 13-3. The display device 100S further includes: the inorganic insulating film 16 formed on the openings 14C-1, 14C-2, 14C-3 of the organic insulating film 14 and the organic insulating film 14; and the pixel electrodes 18-1, 18-2, 18-3 formed on the openings 16-1, 16-2, 16-3 of the inorganic insulating film 16 and the inorganic insulating film 16. Disposed at place (SUBPIXEL 1) between the signal line 12-1 and the signal line 12-2 are the drain electrodes 13-1, 13-2, the openings 14C-1, 14C-2 of the organic insulating film 14, the openings 16-1, 16-2 of the inorganic insulating film 16, and the pixel electrodes 18-1, 18-2. Disposed at place (SUBPIXEL 2) between the signal line 12-3 and the signal line 12-4 are the drain electrode 13-3, the opening 14C-3 of the organic insulating film 14, the opening 16C-3 of the inorganic insulating film 16 and the pixel electrode 18-3. In the display device 100S, the subpixel part (SUBPIXEL 1) including the R subpixel and the G subpixel dictates the need for forming the two openings 14C-1, 14C-2 of the organic insulating film in a width of about a half of the width of one pixel, which makes the pixel layout of high definition pixels more difficult than that of the first comparative example.

As shown in FIG. 12 and FIG. 13, an array substrate of the display device 100B according to the second example includes: the signal lines 12-1 (SL1), 12-2 (SL2), 12-3 (SL3); the drain electrodes 13-1, 13-2, 13-3; and the organic insulating film 14 formed on the signal lines 12-1, 12-2, 12-3 and the drain electrodes 13-1, 13-2, 13-3. The array substrate of the display device 100B further includes: the inorganic insulating film 16 formed on the opening 14C of the organic insulating film 14, the opening (contact hole) 14C-3 of the organic insulating film 14 and the organic insulating film 14; and the pixel electrodes 18-1, 18-2, 18-3 formed on the openings 16C-1, 16C-2, 16-3 of the inorganic insulating film 16 and the inorganic insulating film 16. Disposed at place (SUBPIXEL 1) between the signal line 12-1 and the signal line 12-2 are the drain electrodes 13-1, 13-2, the opening 14C of the organic insulating film 14, the openings 16C-1, 16C-2 of the inorganic insulating film 16, and the pixel electrodes 18-1, 18-2. Disposed at place (SUBPIXEL 2) between the signal line 12-3 and the signal line 12-4 are the drain electrode 13-3, the opening 14C-3 of the organic insulating film 14, the opening 16C-3 of the inorganic insulating film 16 and the pixel electrode 18-3. Similarly to that of the display device 100A, the array substrate of the display device 100B includes: the unillustrated glass substrate, the unillustrated TFTs connected to the drain electrodes, the scanning lines connected to the gate electrodes of the TFTs, the common electrode disposed between the organic insulating film 14 and the inorganic insulating film 16, and the like. The signal lines are connected to the source electrodes of the unillustrated TFTs. Similarly to that of the display device 100A, the counter substrate of the display device 100B includes the unillustrated black matrix and color filters, and the like.

In the display device 100B, the opening 14C of the organic insulating film is so formed as to span two subpixels for providing the respective connections of the drain electrodes 13-1, 13-2 with the pixel electrodes 18-1, 18-2. This pixel configuration negates the need for minifying the opening of the organic insulating film even though the pixel is miniaturized in size. The size of the drain electrode just need be larger than the minimum opening width of the inorganic insulating film. The drain electrode can be reduced in size because the minimum opening width of the inorganic insulating film can be defined to be smaller than the minimum opening width of the organic insulating film, as described above.

While the opening 14C of the organic insulating film is so formed as to span two subpixels (one pixel), the opening 14C of the organic insulating film may also be so formed as to span three subpixels (one pixel), more than one pixel, or all the pixels in the X-direction. The Y-direction width of the drain electrode is defined to be larger than the Y-direction width of the opening 14C of the organic insulating film, but may be smaller than the Y-direction width of the opening 14C of the organic insulating film.

What is claimed is:

1. A display device comprising:
an array substrate; and
a counter substrate, wherein
the array substrate comprises:
first and second drain electrodes adjacent to each other;
signal lines;
an organic insulating film formed on the signal lines;
an inorganic insulating film formed on the organic insulating film; and
first and second pixel electrodes formed on the inorganic insulating film,
wherein
the organic insulating film includes an organic insulating film opening,
the organic insulating film opening has a portion overlapping from the first drain electrode to the second drain electrode in plan view,
the inorganic insulating film covering the organic insulating film opening includes first and second inorganic insulating film openings,
the first pixel electrode is connected to the first drain electrode via the first inorganic insulating film opening, and
the second pixel electrode is connected to the second drain electrode via the second inorganic insulating film opening.

2. The display device according to claim 1,
wherein the first drain electrode is an electrode of a TFT for a first subpixel, and
the second drain electrode is an electrode of a TFT for a second subpixel adjoining the first subpixel.

3. The display device according to claim 2, wherein the second subpixel adjoins the first subpixel in a direction different from a direction where the signal line is extended.

4. The display device according to claim 3, wherein the signal line is laid between the first drain electrode and the second drain electrode.

5. The display device according to claim 3, wherein the first and second pixel electrodes are respectively extended from the first and second inorganic insulating film openings in the same direction along the signal line.

6. The display device according to claim 3, further comprising a third drain electrode and a third pixel electrode formed on the inorganic insulating film,
wherein the organic insulating film opening is formed in a manner to span the first drain electrode, the second drain electrode, and the third drain electrode,
the inorganic insulating film covering the organic insulating film opening includes a third inorganic insulating film opening,
the first pixel electrode is connected to the first drain electrode via the first inorganic insulating film opening,
the second pixel electrode is connected to the second drain electrode via the second inorganic insulating film opening, and
the third pixel electrode is connected to the third drain electrode via the third inorganic insulating film opening.

7. The display device according to claim 6,
wherein the third drain electrode is an electrode of a TFT for a third subpixel, and
the third drain electrode is the electrode of the TFT for the third subpixel adjoining the second subpixel.

8. The display device according to claim 7, wherein the third subpixel adjoins the second subpixel in a direction different from the direction where the signal line is extended.

9. The display device according to claim 2, wherein the second subpixel adjoins the first subpixel in the direction where the signal line is extended.

10. The display device according to claim 9, wherein the first and second pixel electrodes are respectively extended from the first and second inorganic insulating film openings in the opposite directions along the signal line.

11. The display device according to claim 9, further comprising a third drain electrode and a third pixel electrode formed on the inorganic insulating film, wherein the organic insulating film includes a second organic insulating film opening, the inorganic insulating film covering the second organic insulating film opening includes a third inorganic insulating film opening, and the third pixel electrode is connected to the third drain electrode via the third inorganic insulating film opening.

12. The display device according to claim 1, wherein the first and second drain electrodes are accommodated in the opening of the organic insulating film.

13. The display device according to claim 1, further comprising a liquid crystal layer sandwiched between the array substrate and the counter substrate.

14. The display device according to claim 1, wherein the counter substrate includes a black matrix and color filters.

15. A display device comprising:

an array substrate;

a counter substrate; and a liquid crystal layer sandwiched between the array substrate and the counter substrate, wherein the array substrate comprises:

scanning lines extended in a first direction;

a first drain electrode of a TFT for a first subpixel;

a second drain electrode of a TFT for a second subpixel adjacent to the first drain electrode;

a third drain electrode of a TFT for a third subpixel;

signal lines extended in a second direction;

an organic insulating film formed on the signal lines;

an inorganic insulating film formed on the organic insulating film; and first, second and third pixel electrodes formed on the inorganic insulating film, wherein the organic insulating film includes a first organic insulating film opening and a second organic insulating film opening, the first organic insulating film opening has a portion overlapping from the first drain electrode to the second drain electrode in plan view, the inorganic insulating film covering the first organic insulating film opening includes first and second inorganic insulating film openings, the first pixel electrode is connected to the first drain electrode via the first inorganic insulating film opening, the second pixel electrode is connected to the second drain electrode via the second inorganic insulating film opening, the inorganic insulating film covering the second organic insulating film opening includes a third inorganic insulating film opening, and the third pixel electrode is connected to the third drain electrode via the third inorganic insulating film opening.

16. The display device according to claim 15, wherein the second subpixel adjoins the first subpixel in the first direction.

17. The display device according to claim 16, wherein the first and second pixel electrodes are respectively extended from the first and second inorganic insulating film openings in the opposite directions that coincide with the first direction.

18. The display device according to claim 17, wherein the first and second drain electrodes are accommodated in the opening of the organic insulating film.

* * * * *